US012601058B2

(12) United States Patent
    Okajima

(10) Patent No.:    US 12,601,058 B2
(45) Date of Patent:        Apr. 14, 2026

(54) SUBSTRATE PROCESSING APPARATUS, METHOD OF MANUFACTURING SEMICONDUCTOR DEVICE AND NON-TRANSITORY COMPUTER-READABLE RECORDING MEDIUM

(71) Applicant: Kokusai Electric Corporation, Tokyo (JP)

(72) Inventor: Yusaku Okajima, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 364 days.

(21) Appl. No.: 17/853,377

(22) Filed: Jun. 29, 2022

(65) Prior Publication Data

US 2022/0349061 A1     Nov. 3, 2022

Related U.S. Application Data

(63) Continuation of application No. PCT/JP2020/004436, filed on Feb. 5, 2020.

(51) Int. Cl.
    *C23C 16/455*        (2006.01)

(52) U.S. Cl.
    CPC .. *C23C 16/45578* (2013.01); *C23C 16/45519* (2013.01)

(58) Field of Classification Search
    CPC ............................................... C23C 16/45578
    See application file for complete search history.

(56) References Cited

U.S. PATENT DOCUMENTS 4,745,088  A  *   5/1988   Inoue ...................... C23C 16/46
                                                           118/730
2008/0173238  A1*  7/2008  Nakashima ......... C23C 16/4584
                                                           438/758
2009/0017638  A1*  1/2009  Yoshino ............ C23C 16/45576
                                                           118/724
2012/0231407  A1   9/2012  Kadobe et al.
2012/0260857  A1  10/2012  Takahashi et al.
            (Continued)

FOREIGN PATENT DOCUMENTS

JP          11-21432  A        8/1999
JP        2008244443  A       10/2008
            (Continued)

OTHER PUBLICATIONS

Office Action in corresponding Taiwan Patent Application No. 110102975, issued Apr. 15, 2022, with English translation.
            (Continued)

*Primary Examiner* — Keath T Chen
(74) *Attorney, Agent, or Firm* — Edell, Shapiro & Finnan, LLC

(57)                    ABSTRACT

According to one aspect of a technique the present disclosure, there is provided a substrate processing apparatus including: a reaction tube in which a substrate is accommodated; a nozzle accommodation structure provided at a side surface of the reaction tube and extending in a direction parallel to a surface of the substrate; a gas supply nozzle inserted in the nozzle accommodation structure and extending from an outside of the reaction tube to an inside of the reaction tube; and a first gas supply structure through which a first gas is supplied to the gas supply nozzle.

17 Claims, 9 Drawing Sheets

(56)          References Cited

U.S. PATENT DOCUMENTS

| 2017/0025293 A1 | 1/2017 | Jung et al. | |
| 2018/0033659 A1* | 2/2018 | Yan | B08B 15/00 |
| 2018/0090322 A1* | 3/2018 | Jung | C23C 16/4412 |
| 2019/0067066 A1* | 2/2019 | Aiso | H01L 21/67748 |
| 2019/0360098 A1* | 11/2019 | Shimada | H01L 21/67109 |

FOREIGN PATENT DOCUMENTS

| JP | 2011195863 | * 10/2011 | C23C 16/455 |
| JP | 2012186367 A | 9/2012 | |
| JP | 2012227265 A | 11/2012 | |
| JP | 2017-28260 A | 2/2017 | |

OTHER PUBLICATIONS

Notice of Reasons for Refusal with English translation in Japanese Application No. 202-575170, dated Mar. 2, 2023, 14 pages.

* cited by examiner

Figure 5:
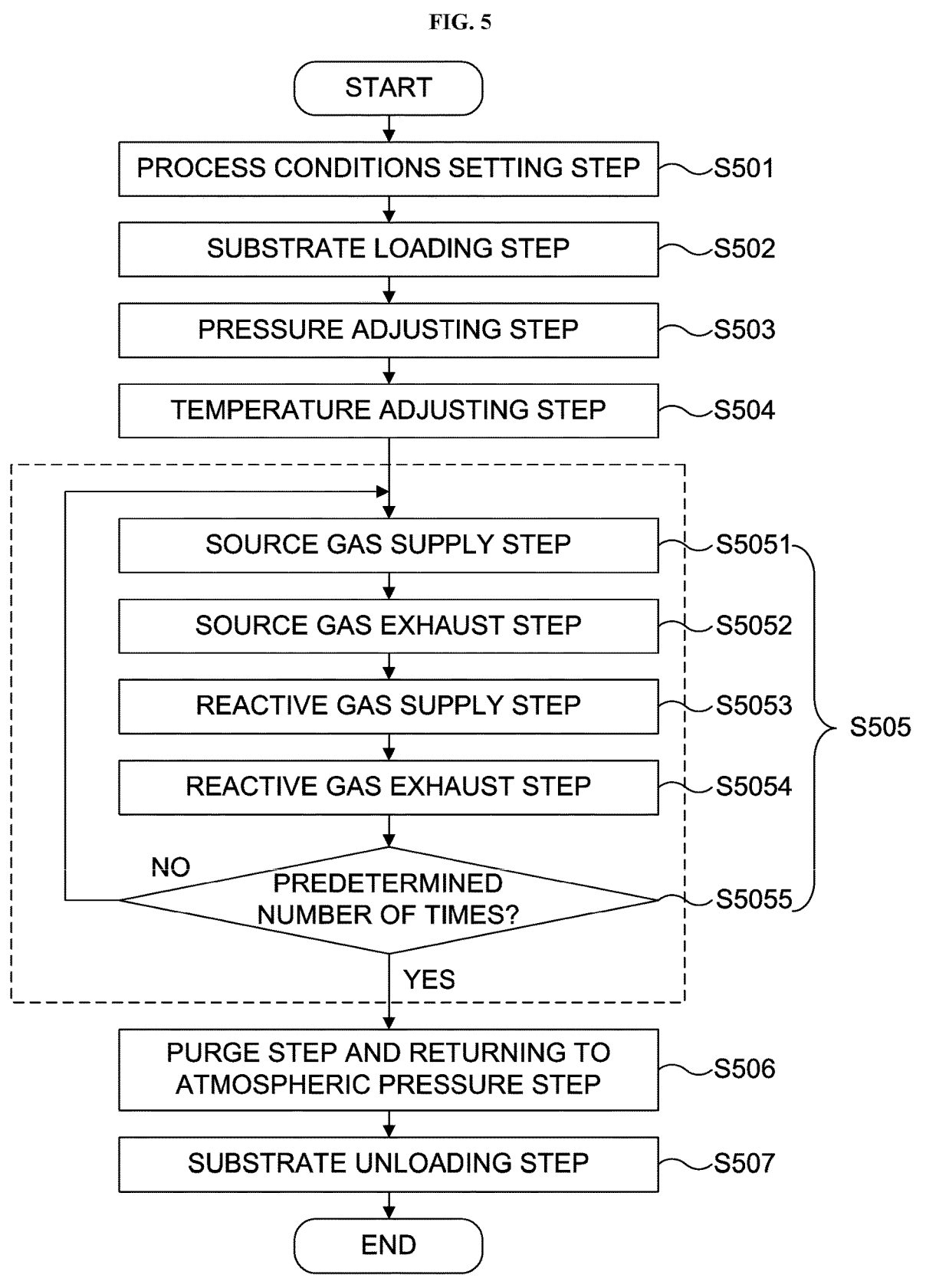

START

PROCESS CONDITIONS SETTING STEP    ∽S501

SUBSTRATE LOADING STEP    ∽S502

PRESSURE ADJUSTING STEP    ∽S503

TEMPERATURE ADJUSTING STEP    ∽S504

SOURCE GAS SUPPLY STEP    ∽S5051

SOURCE GAS EXHAUST STEP    ∽S5052

REACTIVE GAS SUPPLY STEP    ∽S5053

REACTIVE GAS EXHAUST STEP    ∽S5054

}S505

NO    PREDETERMINED NUMBER OF TIMES?    ∽S5055

YES

PURGE STEP AND RETURNING TO ATMOSPHERIC PRESSURE STEP    ∽S506

SUBSTRATE UNLOADING STEP    ∽S507

END

SUBSTRATE PROCESSING APPARATUS, METHOD OF MANUFACTURING SEMICONDUCTOR DEVICE AND NON-TRANSITORY COMPUTER-READABLE RECORDING MEDIUM

CROSS REFERENCE TO RELATED APPLICATIONS

This application is a continuation of International Application No. PCT/JP2020/004436, filed on Feb. 5, 2020, the entire contents of which are hereby incorporated by reference.

TECHNICAL FIELD

The present disclosure relates to a substrate processing apparatus, a method of manufacturing a semiconductor device and a non-transitory computer-readable recording medium.

BACKGROUND

According to some related arts, there is provided a substrate processing apparatus capable of processing a plurality of substrates. The plurality of substrates to be processed may be arranged in a reaction tube in a multistage manner. For example, the substrate processing apparatus may include: a reaction vessel (that is, the reaction tube) in which a process of forming a film containing a plurality of elements on the plurality of substrates is performed; a heater capable of heating an inside of the reaction vessel; at least one nozzle provided in the reaction vessel such that at least a part thereof faces the heater, wherein a first gas (which contains at least one element among the plurality of elements constituting the film and is capable of depositing the film by itself) is supplied into the reaction vessel through the at least one nozzle; and a distribution pipe provided so as to cover at least the part of the at least one nozzle facing the heater, wherein a second gas (which contains at least one element among the plurality of elements constituting the film and is incapable of depositing the film by itself) is circulated in the distribution pipe and supplied into the reaction vessel.

In a vertical type substrate processing apparatus serving as the substrate processing apparatus, a nozzle is provided from a lower portion toward an upper portion of the reaction tube in a vertical direction, and a plurality of holes in accordance with the number of wafers (that is, the substrates) arranged in the reaction tube are provided at the nozzle. According to the configuration in which the first gas containing at least one element among the plurality of elements constituting the film and is capable of depositing the film by itself is ejected (supplied) from the nozzle into the reaction tube, the first gas is heated by the heater and a decomposition of the first gas proceeds inside the nozzle extending in the vertical direction. Therefore, a decomposition degree of the first gas may vary at locations of the nozzle in the vertical direction. As a result, a film-forming state of a wafer placed on the upper portion of the reaction tube may be different from that of a wafer placed on the lower portion of the reaction tube.

SUMMARY

According to the present disclosure, there is provided a technique capable of improving a processing uniformity for each of a plurality of substrates.

According to one or more embodiments of the present disclosure, there is provided a technique related to a substrate processing apparatus including: a reaction tube in which a substrate is accommodated; a nozzle accommodation structure provided at a side surface of the reaction tube and extending in a direction parallel to a surface of the substrate; a gas supply nozzle inserted in the nozzle accommodation structure and extending from an outside of the reaction tube to an inside of the reaction tube; and a first gas supply structure through which a first gas is supplied to the gas supply nozzle.

BRIEF DESCRIPTION OF THE DRAWINGS

FIG. 1B is a block diagram schematically illustrating a configuration of a controller of the substrate processing apparatus according to the first embodiment of the present disclosure.

FIG. 5 is a flow chart schematically illustrating a process flow of a substrate processing method according to the first embodiment of the present disclosure.

DETAILED DESCRIPTION

Figure 1A:
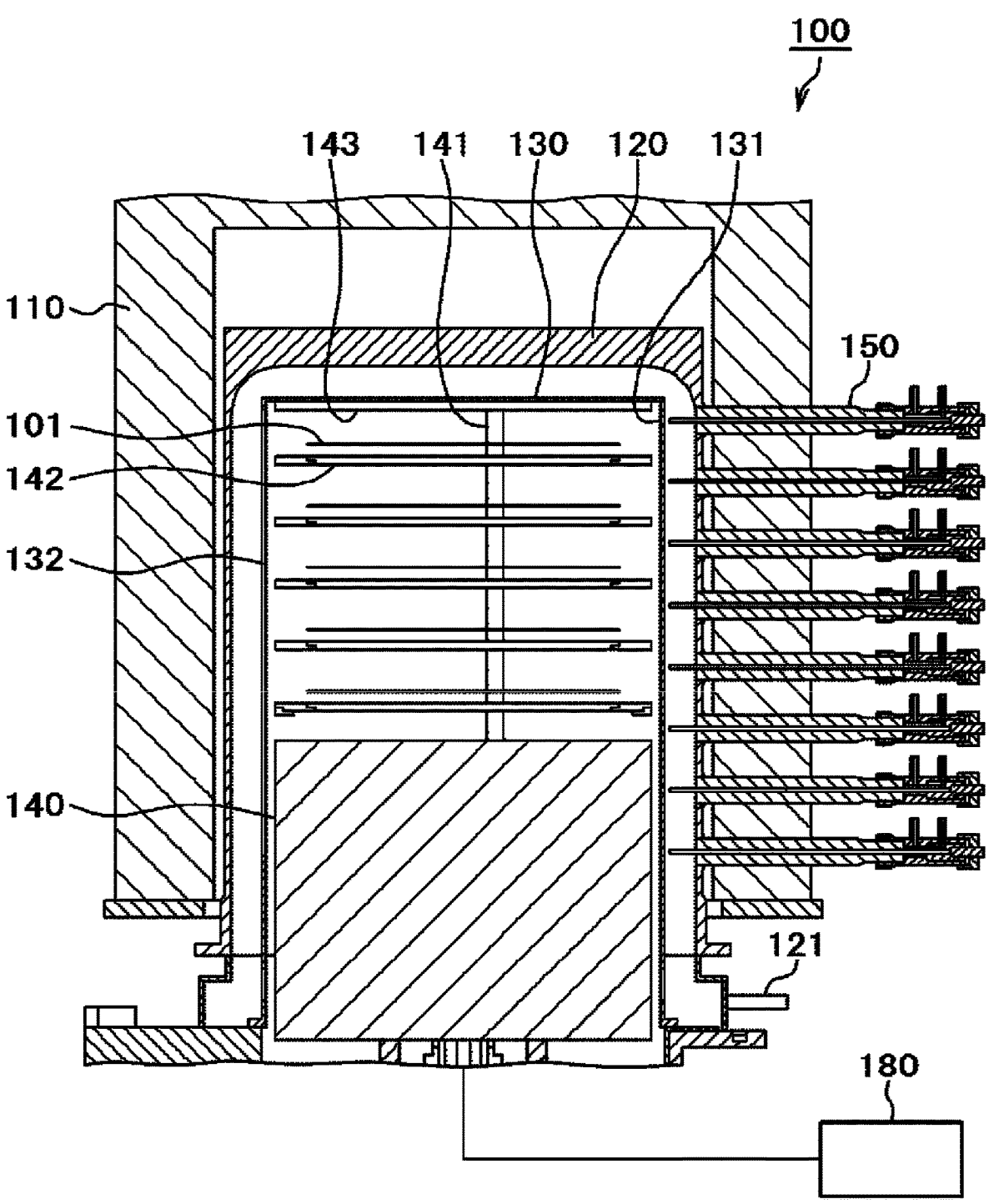
FIG. 1A is a diagram schematically illustrating a cross-section of a part of a substrate processing apparatus according to a first embodiment of the present disclosure.

When a gas such as a source gas and a reactive gas is supplied into a reaction tube through a nozzle (or a gas supply pipe), a reaction product may be generated at a front end (tip) of the nozzle (or the gas supply pipe). Thereby, the reaction product may easily adhere to the front end of the nozzle (or the gas supply pipe) as it is. As the reaction product adhering to the front end of the nozzle (or the gas supply pipe) gradually increases (or grows), a hole provided at the front end of the nozzle (or the gas supply pipe) may be clogged, or the reaction product may be peeled off from the front end of the nozzle (or the gas supply pipe) and may adhere to a substrate to be processed. For example, a part of the reaction product may adhere to the substrate to be processed. As a result, foreign matters such as particles may be generated at a surface of the substrate to be processed.

In order to address problems described above, according to a technique of the present disclosure, there are provided a substrate processing apparatus capable of uniformly performing a film-forming process with respect to surfaces of a plurality of substrates (that is, wafers) arranged in the reaction tube with a predetermined interval therebetween in a vertical direction, a method of manufacturing a semiconductor device using the substrate processing apparatus and a non-transitory computer-readable recording medium storing a program that causes, by a computer, the substrate processing apparatus to perform the method of manufacturing the semiconductor device. That is, according to the technique of the present disclosure, a structure through which an inert gas is supplied is provided on an outer periphery of a gas nozzle through which the source gas or the reactive gas is supplied. Thereby, it is possible to prevent the reactive gas or the source gas from entering an outside of the gas nozzle from the reaction tube (or an inner tube) and to prevent the reaction product from adhering to the outer periphery of the gas nozzle. As a result, it is possible to improve a uniformity and quality of a film formed on the surface of the substrate.

EMBODIMENTS OF PRESENT DISCLOSURE

Hereinafter, one or more embodiments (also simply referred to as "embodiments") of the technique of the present disclosure will be described with reference to the drawings. In the drawings for explaining the embodiments, like reference numerals represent like components, and redundant descriptions related thereto will be omitted in principle.

However, the technique of the present disclosure is not construed as being limited to the contents of the embodiments described below. Those skilled in the art will easily understand that specific configurations of the technique of the present disclosure can be changed without departing from the idea and the scope of the technique of the present disclosure.

First Embodiment

A first embodiment of the technique of the present disclosure will be described with reference to FIGS. 1A through 3. FIG. 1A is a diagram schematically illustrating a cross-section of a part of a substrate processing apparatus 100 according to the first embodiment of the present disclosure. In FIG. 1A, a reference numeral 120 indicates a reaction tube, a reference numeral 130 indicates an inner tube, and a reference numeral 140 indicates a substrate support (which is a substrate retainer or a boat) configured to support (hold or accommodate) a plurality of substrates including a substrate (also referred to as a "wafer") 101. Hereinafter, the plurality of substrates including the substrate 101 may also be simply referred to as substrates 101. More specifically, for example, a plurality of partition plates including a partition plate 142 supported by a partition plate support 141 are provided so as to space apart (or separate) the substrates 101. Hereinafter, the plurality of partition plates including the partition plate 142 may also be simply referred to as partition plates 142. A reference numeral 143 indicates a top plate provided at a top of the partition plates 142. By using a vertical driver (which is a boat elevator) (not shown), the substrates 101 accommodated in the substrate support 140 may be transferred (loaded) into or transferred (unloaded) out of the inner tube 130.

A reference numeral 110 indicates a heater. With the substrate support 140 provided in the inner tube 130 by operating the vertical driver (not shown), the heater 110 is capable of heating the inner tube 130 (and the reaction tube 120). For example, the heater 110 may be divided into a plurality of heater structures (blocks) in the vertical direction, and a heating state of the heater 110 can be controlled for each heater structure based on data of a temperature measuring structure such as a thermometer (not shown).

A reference numeral 150 indicates a gas supply structure through which the gas such as the source gas and the reactive gas is supplied into the inner tube 130. A plurality of gas supply structures including the gas supply structure 150 are provided in the same plane as a cross-section shown in FIG. 1A such that the gas is supplied to each of the substrates 101 according to a vertical pitch (interval) of the substrates 101 supported by the substrate support 140. Hereinafter, the plurality of gas supply structures including the gas supply structure 150 may also be simply referred to as gas supply structures 150. The gas supply structures 150 are arranged in a direction substantially parallel to surfaces of the substrates 101 supported by the substrate support 140 in the inner tube 130.

The inner tube 130 is provided with a plurality of gas introduction holes including a gas introduction hole 131 such that the gas supplied through the gas supply structures 150 can be introduced into the inner tube 130 at locations where front ends of the gas supply structures 150 are provided. Hereinafter, the plurality of gas introduction holes including the gas introduction hole 131 may also be simply referred to as gas introduction holes 131.

In addition, a slit 132 is provided in a portion of the inner tube 130 facing locations where the gas introduction holes 131 are provided. A part of the gas supplied into the inner tube 130 through the gas introduction holes 131, which did not contribute to a reaction inside the inner tube 130 such as the reaction on the surfaces of the substrates 101 supported by the substrate support 140, is discharged (or exhausted) from an inside of the inner tube 130.

The gas discharged from the inside of the inner tube 130 toward the reaction tube 120 through the slit 132 is discharged to an outside of the reaction tube 120 by an exhaust structure (not shown) through an exhaust pipe 121.

A reference numeral 180 indicates a controller. The controller 180 controls operations of components constituting the substrate processing apparatus 100. The controller 180 will be described in detail with reference to FIG. 1B.

Figure 2:
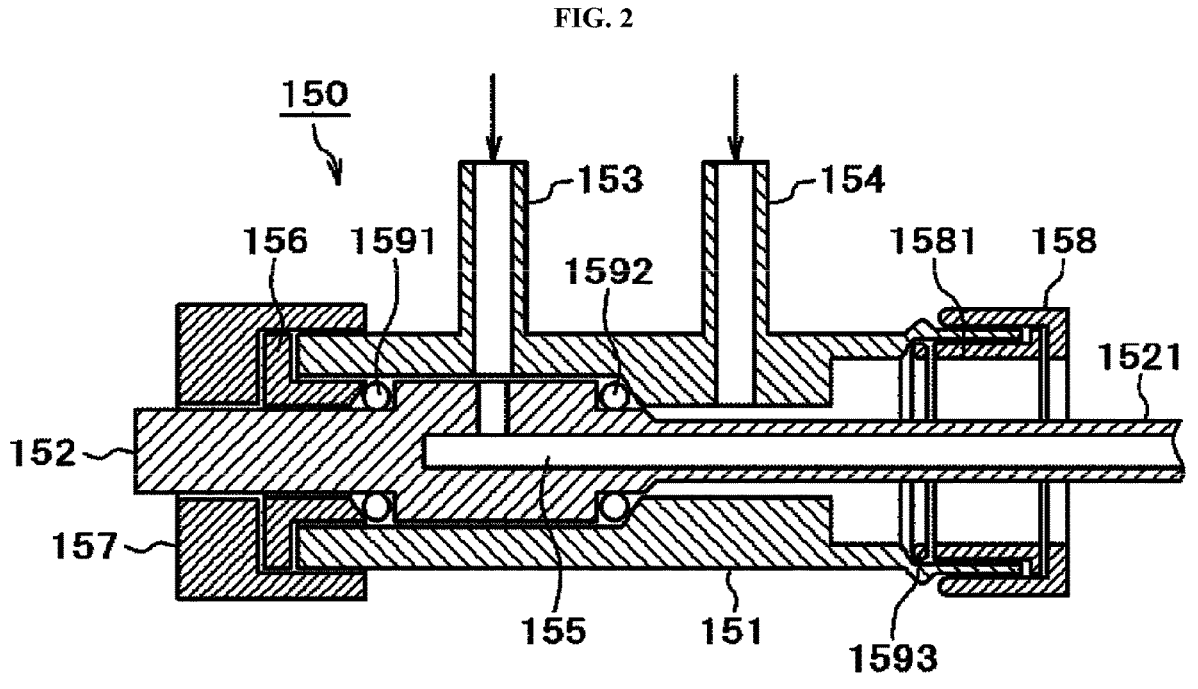
FIG. 2 is a diagram schematically illustrating a cross-section of a gas supply structure of the substrate processing apparatus according to the first embodiment of the present disclosure.

FIG. 2 is a diagram schematically illustrating a cross-section of the gas supply structure 150. The gas supply structure 150 may include: a main body structure (which is a main body) 151; an introduction pipe structure 152 installed inside the main body structure 151; O-rings 1591 and 1592 capable of sealing between the introduction pipe structure 152 and the main body structure 151; a bush 156; a nut 157 capable of pushing the bush 156 to change the shape of the O-rings 1591 and 1592; an O-ring 1593 capable of sealing between a nozzle accommodation pipe described later and the introduction pipe structure 152; a bush 1581; and a nut 158 capable of pushing the bush 1581 to deform the O-ring 1593.

Inner surfaces of the nuts 157 and 158 are threaded. Further, portions of the main body structure 151 where the nuts 157 and 158 are attached are also threaded. By attaching the nuts 157 and 158 to the threaded portions of the main body structure 151, respectively, the bush 156 and the bush 1581 are pushed in to deform the O-rings 1591 and 1592 and the O-ring 1593.

The main body structure 151 is provided with a first gas supply pipe 153 through which the gas is introduced (supplied) into the inner tube 130 and a second gas supply pipe 154 through which the inert gas is supplied between the main body structure 151 and the introduction pipe structure 152. Each of the first gas supply pipe 153 and the second gas supply pipe 154 is connected to a gas supply source 1500 shown in FIG. 3.

Figure 3:
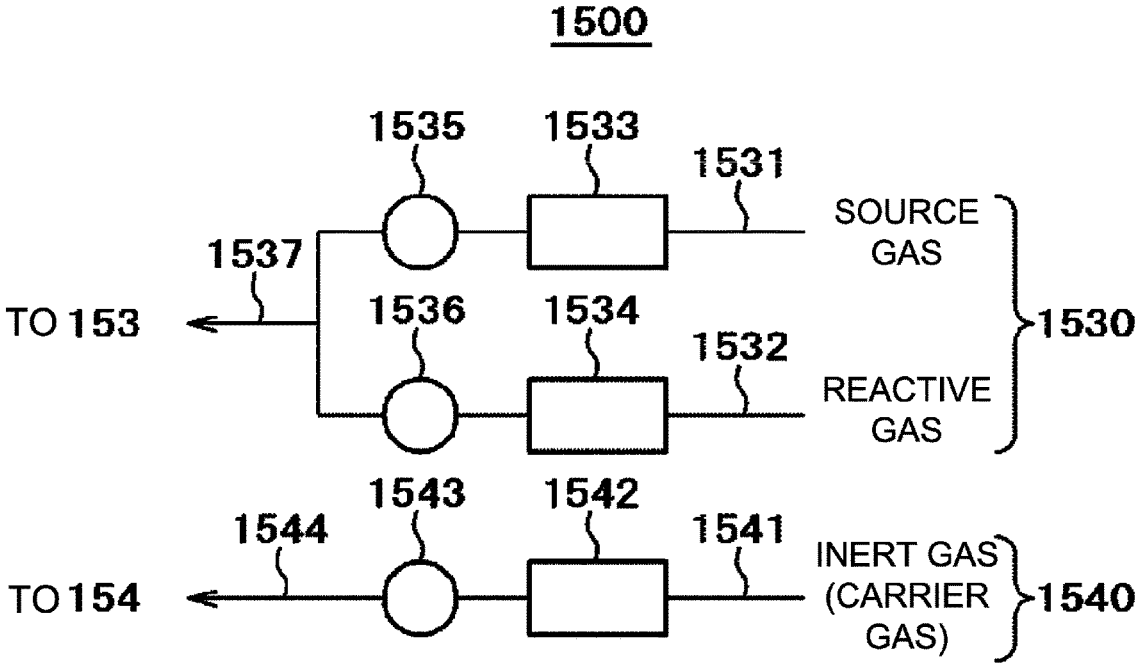
FIG. 3 is a block diagram schematically illustrating a configuration of a gas supply source of the substrate processing apparatus according to the first embodiment of the present disclosure.

FIG. 3 is a diagram schematically illustrating a configuration of the gas supply source 1500. The gas supply source 1500 includes: a source gas and reactive gas supplier (which is a source gas and reactive gas supply system) 1530 through which the source gas or the reactive gas is supplied to the first gas supply pipe 153; and an inert gas supplier (which is an inert gas supply system) 1540 through which the inert gas is supplied to the second gas supply pipe 154.

The source gas and reactive gas supplier 1530 may include: a source gas supply pipe 1531 through which the source gas is supplied; a mass flow controller (MFC) 1533 capable of controlling a flow rate of the source gas; a valve 1535 configured to be opened or closed so as to control a flow of the source gas; a reactive gas supply pipe 1532 through which the reactive gas is supplied; a mass flow controller (MFC) 1534 capable of controlling a flow rate of the reactive gas; a valve 1536 configured to be opened or closed so as to control a flow of the reactive gas; and a gas supply pipe 1537 connected to the first gas supply pipe 153.

The inert gas supplier 1540 may include: an inert gas supply pipe 1541 through which the inert gas is supplied; a mass flow controller (MFC) 1542 capable of controlling a flow rate of the inert gas; a valve 1543 configured to be opened or closed so as to control a flow of the inert gas; and a gas supply pipe 1544 connected to the second gas supply pipe 154.

In such a configuration, in the source gas and reactive gas supplier 1530, with the flow of the reactive gas stopped by closing the valve 1536 (that is, by setting the valve 1536 to an "OFF" state), the source gas supplied from a gas source (not shown) is passed through the source gas supply pipe 1531. The flow rate of the source gas is adjusted by the mass flow controller (MFC) 1533, and the valve 1535 is opened (that is, the valve 1535 is set to an "ON" state) to supply the source gas. Thereby, the source gas is supplied through the gas supply pipe 1537 to the first gas supply pipe 153.

Further, with the flow of the source gas stopped by closing the valve 1535 (that is, by setting the valve 1535 to the "OFF" state), the reactive gas supplied from a gas source (not shown) is passed through the reactive gas supply pipe 1532. The flow rate of the reactive gas is adjusted by the mass flow controller (MFC) 1534, and the valve 1536 is opened (that is, the valve 1536 is set to the "ON" state) to supply the reactive gas. Thereby, the reactive gas is supplied through the gas supply pipe 1537 to the first gas supply pipe 153.

That is, in the source gas and reactive gas supplier 1530, the gas supply pipe 1537 is shared to supply the source gas and the reactive gas, and the valve 1535 and the valve 1536 are alternately switched between the ON state and the OFF state. Thereby, the gas to be supplied from the gas supply pipe 1537 to the first gas supply pipe 153 can be switched between the source gas and the reactive gas.

Further, in the inert gas supplier 1540, the inert gas supplied from a gas source (not shown) is passed through the inert gas supply pipe 1541. The flow rate of the inert gas is adjusted by the mass flow controller (MFC) 1542, and the valve 1543 is opened (that is, the valve 1543 is set to the "ON" state) to supply the inert gas. Thereby, the inert gas is supplied through the gas supply pipe 1544 to the second gas supply pipe 154.

As shown in FIG. 2, in the main body structure 151, a gas introduction hole 155 through which the gas supplied from the first gas supply pipe 153 is supplied into the inner tube 130 is provided. Further, a nozzle 1521 of a pipe-shaped structure is provided in front of a portion of the introduction pipe structure 152 where the inert gas is introduced from the second gas supply pipe 154, and a gap is provided between an inside of the main body structure 151 and the nozzle 1521 at the portion where the inert gas is introduced from the second gas supply pipe 154.

Figure 4:
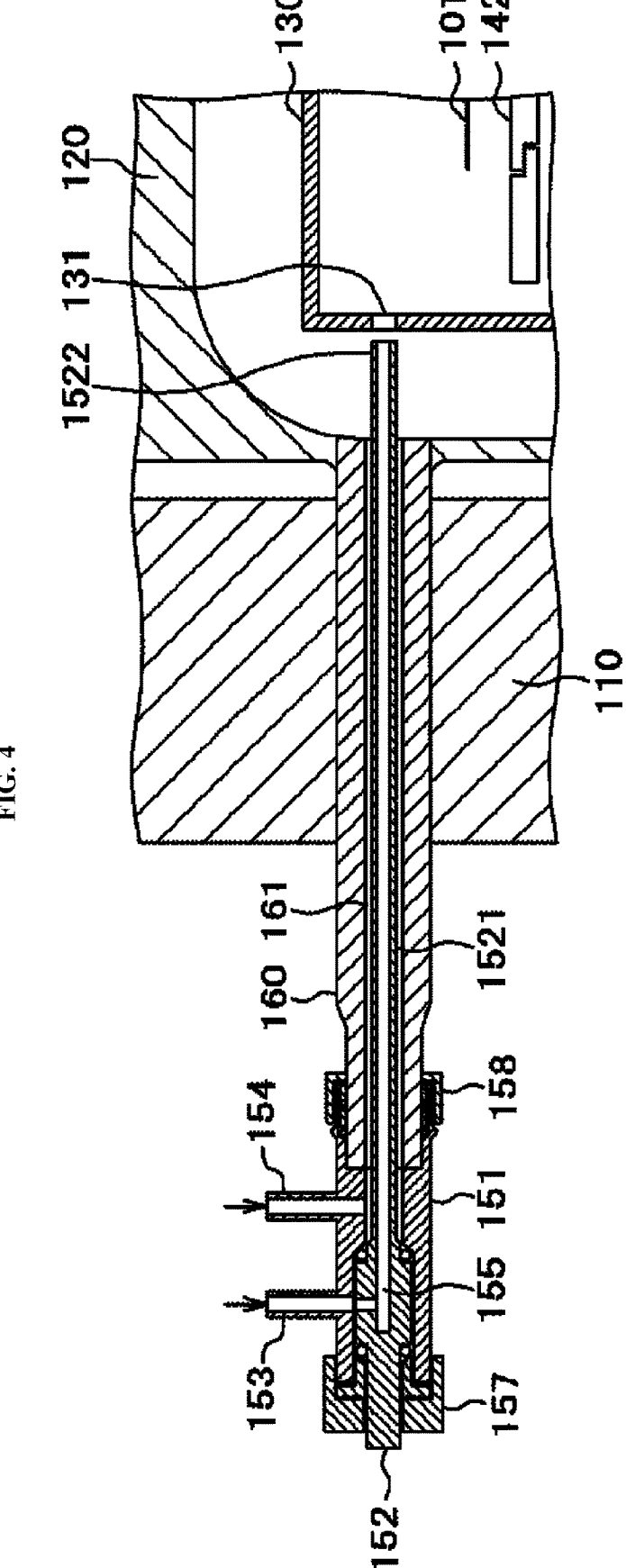
FIG. 4 is a diagram schematically illustrating a cross-section of a part of the substrate processing apparatus according to the first embodiment of the present disclosure when the gas supply structure of the substrate processing apparatus according to the first embodiment is attached to an inner tube.

FIG. 4 is a diagram schematically illustrating a cross-section of a part of the substrate processing apparatus 100 when the gas supply structure 150 is attached so as to face the gas introduction hole 131 provided at the inner tube 130 through the heater 110 and the reaction tube 120. FIG. 4 schematically illustrates an example in which an uppermost gas supply structure among the gas supply structures 150 serves as the gas supply structure 150.

A first front end (tip) of a nozzle accommodation pipe 160 serving as a nozzle accommodation structure is inserted into the main body structure 151 and is fixed by the nut 158. In such a state, a gap is provided between a hole 161 provided inside the nozzle accommodation pipe 160 and the nozzle 1521 of the introduction pipe structure 152. Thereby, and a flow path of the inert gas supplied through the second gas supply pipe 154 is secured. In other words, the nozzle 1521 is configured to be inserted into the nozzle accommodation pipe 160 serving as the nozzle accommodation structure. For example, a plurality of nozzles including the nozzle 1521 are accommodated in a plurality of nozzle accommodation structures including the nozzle accommodation structure, respectively.

Thereby, the gas such as the source gas and the reactive gas supplied through the first gas supply pipe 153 and the inert gas supplied through the second gas supply pipe 154 are supplied into the reaction tube 120 along a coaxial direction parallel to the surfaces of the substrates 101.

A second front end (which is provided opposite to the first front end) of the nozzle accommodation pipe 160 penetrates the heater 110 and reaches an inside of the reaction tube 120. On the other hand, a front end 1522 of the nozzle 1521 of the introduction pipe structure 152 extends further inside the reaction tube 120 than the second front end of the nozzle accommodation pipe 160, and reaches immediately before the gas introduction hole 131 provided in the inner tube 130.

In such a state, when the gas (the source gas or the reactive gas) is supplied through the first gas supply pipe 153 while heating the nozzle 1521 and the inner tube 130 by the heater 110, the gas supplied through the first gas supply pipe 153 passes through the gas introduction hole 155 provided in the introduction pipe structure 152, and is discharged (or ejected) into the reaction tube 120 through the front end 1522 of the nozzle 1521 of the introduction pipe structure 152. Most of the gas ejected into the reaction tube 120 is supplied to the inside of the inner tube 130 through the gas introduction hole 131 provided in the inner tube 130, and a film is formed by reacting the gas on the surfaces of the substrates 101 supported by the substrate support 140 in the inner tube 130.

When the gas is supplied, a part of the gas ejected into the reaction tube 120 through the front end 1522 of the nozzle 1521 of the introduction pipe structure 152 is not supplied into the inner tube 130 through the gas introduction hole 131 and remains in the reaction tube 120.

When the gas remaining in the reaction tube 120 without being supplied into the inner tube 130 is left as it is, a reaction product may be generated by the gas remaining around the front end 1522 of the nozzle 1521 of the introduction pipe structure 152. When the reaction product is deposited on the front end 1522, a part of the reaction product may be peeled off, scattered inside the inner tube 130, and adhere to the surface of the substrate 101. As a result, a quality of the film formed on the surface of the substrate 101 may deteriorate.

However, according to the present embodiment, the inert gas is supplied into the reaction tube 120 through the second gas supply pipe 154 via the gap between the hole 161 of the nozzle accommodation pipe 160 and the nozzle 1521 of the introduction pipe structure 152.

In such a configuration, by supplying the inert gas into the reaction tube 120 through the second gas supply pipe 154 while supplying the gas (the source gas or the reactive gas) into the inner tube 130 through the first gas supply pipe 153, the inert gas such as nitrogen ($N_2$) gas is supplied to the vicinity of the front end 1522 of the nozzle 1521 of the introduction pipe structure 152. As a result, the formation of the reaction product by the gas supplied through the first gas supply pipe 153 to the vicinity of the front end 1522 can be suppressed.

According to the present embodiment, the flow rate of the gas (the source gas or the reactive gas) supplied into the inner tube 130 through the first gas supply pipe 153 and the flow rate of the inert gas supplied through the second gas supply pipe 154 are adjusted by mass flow controllers (not shown) controlled by the controller 180, respectively.

According to the present embodiment, the flow rate of the inert gas supplied through the second gas supply pipe 154 is set to be smaller than the flow rate of the gas (the source gas or the reactive gas) supplied through the first gas supply pipe 153. More preferably, the flow rate of the inert gas is set to $\frac{1}{10}$ or less of the flow rate of the gas (the source gas or the reactive gas).

Thereby, the formation of the reaction product can be suppressed. As a result, it is possible to prevent the reaction product from adhering to the surface of the substrate 101 inside the inner tube 130, and it is also possible to maintain a high quality of the film formed on the surface of the substrate 101.

A part of the inert gas supplied through the second gas supply pipe 154 may be introduced into the inner tube 130 through the gas introduction hole 131 provided in the inner tube 130.

The present embodiment is described by way of an example in which the source gas or the reactive gas is supplied into the inner tube 130 through the first gas supply pipe 153. However, instead of the first gas supply pipe 153, a gas supply pipe dedicated to supplying the source gas and a gas supply pipe dedicated to supplying the reactive gas may be provided separately.

Further, the present embodiment is described by way of an example in which the front end 1522 of the nozzle 1521 of the introduction pipe structure 152 extends immediately before the gas introduction hole 131 provided in the inner tube 130. However, the front end 1522 of the nozzle 1521 of the introduction pipe structure 152 may be inserted into the gas introduction hole 131 provided in the inner tube 130.

Further, the present embodiment is described by way of an example in which the inner tube 130 is provided in the reaction tube 120. However, instead of using the inner tube 130, the substrate 101 may be transferred into or out of the reaction tube 120 with the substrate support 140. In such a case, the front end 1522 of the nozzle 1521 of the introduction pipe structure 152 is installed so as to be located in the vicinity of the substrate 101 supported by the substrate support 140.

Controller

As shown in FIG. 1A, the substrate processing apparatus 100 is connected to the controller 180 configured to control the operations of the components constituting the substrate processing apparatus 100.

Figure 1B:
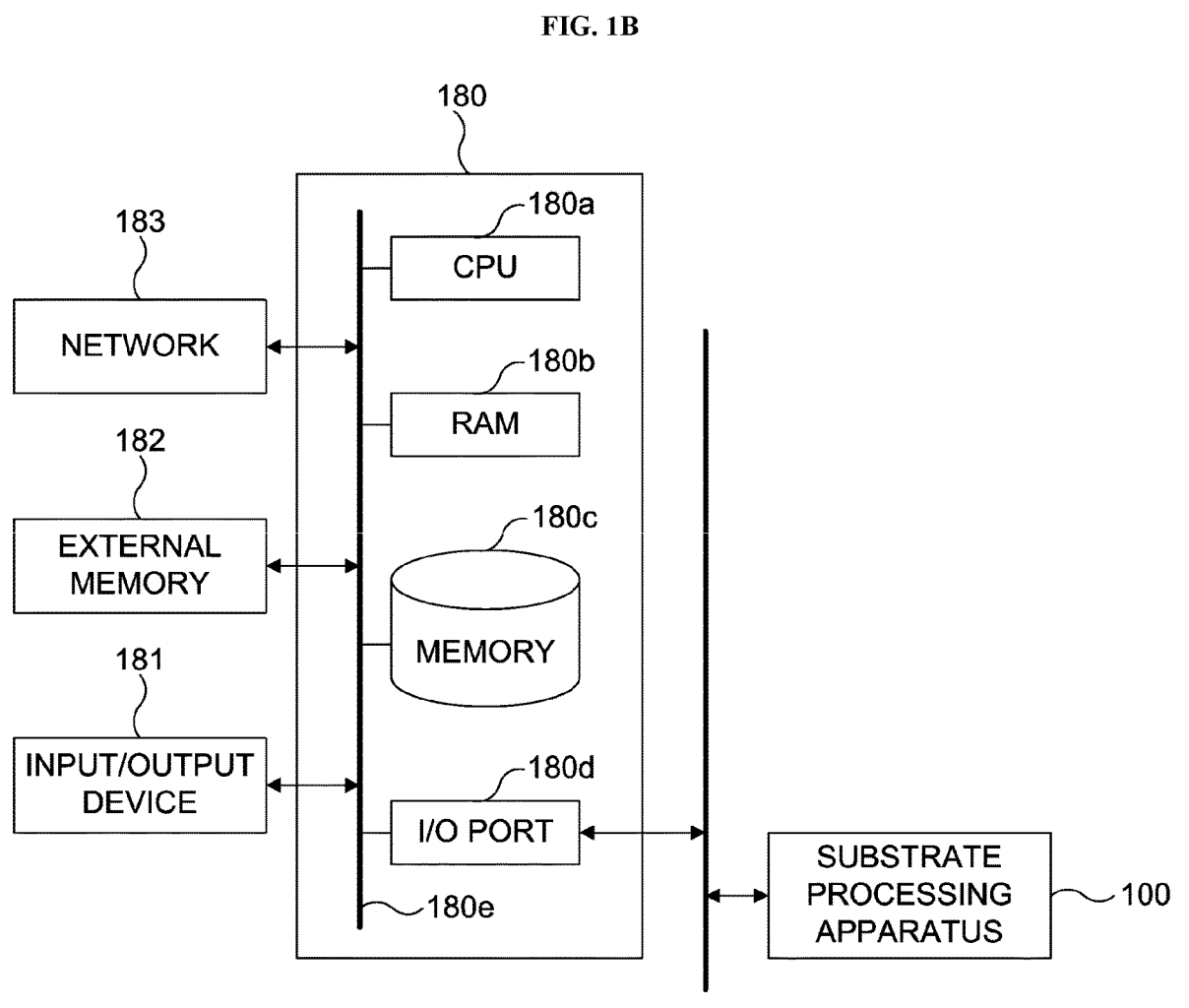

FIG. 1B is a block diagram schematically illustrating a configuration of the controller 180. The controller 180 serving as a control apparatus (control structure) is constituted by a computer including a CPU (Central Processing Unit) 180a, a RAM (Random Access Memory) 180b, a memory 180c and an input/output port (also simply referred to as an "I/O port") 180d. The RAM 180b, the memory 180c and the I/O port 180d may exchange data with the CPU 180a through an internal bus 180e. For example, an input/output device 181 configured by a component such as a touch panel and an external memory 182 may be connected to the controller 180.

The memory 180c is configured by a memory medium such as a flash memory and a hard disk drive (HDD). For example, a control program configured to control the operation of the substrate processing apparatus 100, a process recipe containing information on sequences and conditions of a substrate processing described later, or a database may be readably stored in the memory 180c.

The process recipe is obtained by combining steps of the substrate processing described later such that the controller 180 can execute the steps to acquire a predetermined result, and functions as a program.

Hereafter, the process recipe and the control program may be collectively or individually referred to as a "program". Thus, in the present specification, the term "program" may refer to the process recipe alone, may refer to the control program alone, or may refer to both of the process recipe and the control program. In addition, the RAM 180b functions as a memory area (work area) where a program or data read by the CPU 180a is temporarily stored.

The I/O port 180d is electrically connected to the components such as the heater 110, a substrate loading/unloading port (not shown), the vertical driver (which is the boat elevator) (not shown), a rotational driving motor (not shown), the mass flow controller (not shown) and a vacuum pump (not shown).

In addition, in the present specification, "electrically connected" means that the components are connected by physical cables or the components are capable of communicating with one another to transmit and receive signals (electronic data) to and from one another directly or indirectly. For example, a device for relaying the signals or a device for converting or computing the signals may be provided between the components.

The CPU 180a is configured to read and execute the control program from the memory 180c and read the process recipe from the memory 180c in accordance with an instruction such as an operation command inputted from the controller 180. The CPU 180a is configured to be capable of controlling various operations in accordance with the contents of the process recipe such as an operation of supplying electrical power to the heater 110, an opening and closing operation of the substrate loading/unloading port (not shown), a driving operation of a vertical driving motor (not shown), a driving operation of the vertical driver (not shown) and a driving operation of the rotational driving motor (not shown).

The controller 180 is not limited to a dedicated computer, and the controller 180 may be embodied by a general-purpose computer. For example, the controller 180 according to the present embodiment may be embodied by preparing the external memory 182 (e.g., a magnetic tape, a magnetic disk such as a flexible disk and a hard disk, an optical disk such as a CD and a DVD, a magneto-optical disk such as an MO, a semiconductor memory such as a USB memory and a memory card) in which the above-described program is stored, and installing the program onto the general-purpose computer using the external memory 182.

A method of providing the program to the computer is not limited to the external memory 182. For example, the program may be directly provided to the computer by a communication instrument such as a network 183 (Internet and a dedicated line) instead of the external memory 182. In addition, the memory 180c and the external memory 182 may be embodied by a non-transitory computer-readable recording medium. Hereinafter, the memory 180c and the external memory 182 may be collectively or individually referred to as a recording medium. Thus, in the present specification, the term "recording medium" may refer to the memory 180c alone, may refer to the external memory 182 alone, or may refer to both of the memory 180c and the external memory 182.

Substrate Processing (Film-Forming Process)

Hereinafter, the substrate processing (film-forming process) of forming the film on the substrate 101 using the substrate processing apparatus 100 described with reference to FIGS. 1A through 4 will be described with reference to FIG. 5.

Although the technique of the present disclosure can be applied to one or both of the film-forming process and an etching process, the substrate processing will be described based on a process of forming a silicon oxide (SiO$_2$) film on the substrate 101, which is an example of a process of forming the film on the substrate 101, as a part of a manufacturing process of a semiconductor device. The process of forming the film such as the SiO$_2$ film is performed in the reaction tube 120 of the substrate processing apparatus 100 described above. As described above, by executing the program by the controller 180, the manufacturing process is performed.

In the substrate processing (the manufacturing process of the semiconductor device) according to the present embodiment, first, by driving the vertical driver (not shown) to elevate the substrate support (which is the boat) 140, as shown in FIG. 1A, the substrate support 140 is inserted into the inner tube 130 installed inside the reaction tube 120. In such a state, the substrate 101 placed on the substrate support 140 is provided above the partition plate 142 at a predetermined height (interval).

In such a state, the process of forming the SiO$_2$ film including:

(a) a step of supplying Si$_2$Cl$_6$ (disilicon hexachloride) gas into the inner tube 130 with respect to the substrate 101 accommodated in the inner tube 130 through the front end 1522 of the nozzle 1521 by introducing the Si$_2$Cl$_6$ gas into the gas introduction hole 155 of the gas supply structure 150 through the first gas supply pipe 153;

(b) a step of removing a residual gas in the reaction tube 120 by stopping an introduction of the Si$_2$Cl$_6$ gas through the first gas supply pipe 153 and discharging the residual gas in the reaction tube 120 to the outside of the reaction tube 120 through the exhaust pipe 121;

(c) a step of supplying O$_2$ (oxygen) gas (or O$_3$ (ozone) gas or H$_2$O (water)) into the inner tube 130 with respect to the substrate 101 accommodated in the inner tube 130 through the front end 1522 of the nozzle 1521 by introducing the O$_2$ gas (or O$_3$ gas or H$_2$O) into the gas introduction hole 155 of the gas supply structure 150 through the first gas supply pipe 153; and (d) a step of removing a residual gas in the reaction tube 120 by stopping an introduction of the O$_2$ gas (or O$_3$ gas or H$_2$O) through the first gas supply pipe 153 and discharging the residual gas in the reaction tube 120 to the outside of the reaction tube 120 through the exhaust pipe 121 is performed. The steps (a) to (d) described above are performed a plurality of times to form the SiO$_2$ film on the substrate 101.

Further, in the steps (a) and (c) described above, while supplying the gas such as the Si$_2$Cl$_6$ gas and the O$_2$ gas into the gas introduction hole 155 of the gas supply structure 150 through the first gas supply pipe 153, the inert gas is supplied through the second gas supply pipe 154 to the gap between the hole 161 of the nozzle accommodation pipe 160 and the nozzle 1521 of the introduction pipe structure 152 of the gas supply structure 150. Through the gap described above, the inert gas is supplied to the vicinity of the front end 1522 of the nozzle 1521 inside the reaction tube 120.

Thereby, the formation of the reaction product in the vicinity of the front end 1522 of the nozzle 1521 can be suppressed. As a result, it is possible to prevent the reaction product from adhering to the surface of the substrate 101 inside the inner tube 130, and it is also possible to maintain the high quality of the film formed on the surface of the substrate 101.

Further, in the present specification, the term "substrate" may refer to "a substrate itself" or may refer to "a substrate and a stacked structure (aggregated structure) of predetermined layers or films formed on a surface of the substrate". That is, the term "substrate" may collectively refer to the substrate and the layers or the films formed on the surface of the substrate. In addition, in the present specification, the term "a surface of a substrate" may refer to "a surface (exposed surface) of a substrate itself" or may refer to "a surface of a predetermined layer or a film formed on a substrate, i.e. a top surface (uppermost surface) of the substrate as a stacked structure". In addition, in the present specification, the terms "substrate" and "wafer" may be used as substantially the same meaning.

Subsequently, a specific example of the film-forming process will be described with reference to a flow chart shown in FIG. 5.

Process Conditions Setting Step: S501

First, the CPU 180a of the controller 180 reads the process recipe and the related database stored in the memory 180c and sets process conditions.

Substrate Loading Step: S502

With the substrates 101 placed on and supported by the substrate support 140 one by one, the substrate support 140 is elevated by the vertical driver (which is the boat elevator)

(not shown) such that the substrate support 140 is transferred (loaded) into the inner tube 130 installed inside the reaction tube 120.

Pressure Adjusting Step: S503

With the substrate support 140 loaded in the inner tube 130, an inner atmosphere of the reaction tube 120 is vacuum-exhausted by the vacuum pump (not shown) through the exhaust pipe 121 such that an inner pressure of the reaction tube 120 reaches and is maintained at a desired pressure.

Temperature Adjusting Step: S504

In a state where the inner atmosphere of the reaction tube 120 is vacuum-exhausted by the vacuum pump (not shown), the heater 110 heats the reaction tube 120 based on the process recipe read in the step S501 such that an inner temperature of the reaction tube 120 reaches and is maintained at a desired temperature. When heating the reaction tube 120, an amount of the electric current supplied to the heater 110 is feedback-controlled based on temperature information detected by a temperature sensor (not shown) such that a desired temperature distribution of the inner temperature of the reaction tube 120 can be obtained. The heater 110 continuously heats the reaction tube 120 until at least a processing of the substrate 101 is completed.

$SiO_2$ Film Forming Step: S505

Subsequently, a step of forming the film such as the $SiO_2$ film serving as a first film (that is, an $SiO_2$ film forming step) is performed. For example, a source gas supply step S5051, a source gas exhaust step S5052, a reactive gas supply step S5053, a reactive gas exhaust step S5054 and a determination step S5055 are performed as the $SiO_2$ film forming step S505.

Source Gas Supply Step: S5051

First, by rotationally driving the rotational driving motor (not shown), the partition plate 142 and the substrate 101 supported by the substrate support 140 are rotated.

While the partition plate 142 and the substrate 101 are being rotated, the $Si_2Cl_6$ gas serving as the source gas whose flow rate is adjusted is supplied into the reaction tube 120 through the first gas supply pipe 153 of the gas supply structure 150 via the nozzle 1521. The source gas supplied to the reaction tube 120 is supplied into the inner tube 130 through the gas introduction hole 131 provided in the inner tube 130. A part of the source gas is not supplied into the inner tube 130 and stays in a space between the reaction tube 120 and the inner tube 130. A part of the source gas supplied through the nozzle 1521 (which did not contribute to the reaction on the surface of the substrate 101) flows out to the reaction tube 120 through the slit 132 provided in the inner tube 130, and is exhausted through the exhaust pipe 121.

By introducing the $Si_2Cl_6$ gas into the inner tube 130 through the nozzle 1521, the $Si_2Cl_6$ gas is supplied to the substrate 101 supported by the substrate support 140. For example, a flow rate of the $Si_2Cl_6$ gas supplied to the substrate 101 may be set within a range from 0.002 slm (standard liter per minute) to 1 slm, and more preferably, within a range from 0.1 slm to 1 slm.

When supplying the $Si_2Cl_6$ gas, as a carrier gas, the inert gas such as nitrogen ($N_2$) gas and argon (Ar) gas is introduced into the gas supply structure 150 together with the $Si_2Cl_6$ gas through the second gas supply pipe 154, supplied into the reaction tube 120, and exhausted through the exhaust pipe 121. Specifically, a flow rate of the carrier gas may be set within a range from 0.01 slm to 5 slm, and more preferably, within a range from 0.5 slm to 5 slm.

The carrier gas such as the $N_2$ gas is supplied into the reaction tube 120 through the gap between the hole 161 provided inside the nozzle accommodation pipe 160 and the nozzle 1521, and a part of the carrier gas is supplied into the inner tube 130 through the gas introduction hole 131 provided in the inner tube 130. On the other hand, most of carrier gas such as the $N_2$ gas supplied into the reaction tube 120 is exhausted from the space between the reaction tube 120 and the inner tube 130 through the exhaust pipe 121. When the carrier gas is supplied and exhausted, a temperature of the heater 110 is set such that a temperature of the substrate 101 is within a range from, for example, 250° C. to 550° C.

In the source gas supply step S5051, the $Si_2Cl_6$ gas and the carrier gas such as the $N_2$ gas are supplied into the inner tube 130 without any other gas being supplied into the inner tube 130 together with the $Si_2Cl_6$ gas and the carrier gas. By supplying the $Si_2Cl_6$ gas into the inner tube 130, a silicon-containing layer whose thickness is, for example, within a range from less than a single atomic layer to several atomic layers is formed on the substrate 101 (that is, on a base film on the surface of the substrate 101).

Source Gas Exhaust Step: S5052

After the silicon-containing layer is formed on the surface of the substrate 101 heated to be within a predetermined temperature range by supplying the $Si_2Cl_6$ gas serving as the source gas into the inner tube 130 through the nozzle 1521 for a predetermined time, a supply of the $Si_2Cl_6$ gas is stopped. In the source gas exhaust step S5052, the inner atmosphere of the reaction tube 120 is vacuum-exhausted by the vacuum pump (not shown) to remove the residual gas in the reaction tube 120 and the inner tube 130 such as the $Si_2Cl_6$ gas which did not react or which contributed to the formation of the silicon-containing layer out of the reaction tube 120 and the inner tube 130.

In the source gas exhaust step S5052, the $N_2$ gas serving as the carrier gas is continuously supplied into the reaction tube 120 through the gap between the hole 161 provided inside the nozzle accommodation pipe 160 and the nozzle 1521. The $N_2$ gas serves as a purge gas, which improves the efficiency of removing the residual gas in the reaction tube 120 such as the $Si_2Cl_6$ gas which did not react or which contributed to the formation of the silicon-containing layer out of the reaction tube 120 and the inner tube 130.

Reactive Gas Supply Step: S5053

After the residual gas in the reaction tube 120 and the inner tube 130 is removed, the 02 gas serving as the reactive gas is introduced into the gas supply structure 150 through the first gas supply pipe 153 and supplied into the inner tube 130 through the nozzle 1521 and the reaction tube 120. A part of the $O_2$ gas which did not contribute to the reaction is exhausted out of the reaction tube 120 and the inner tube 130 through the exhaust pipe 121. Thereby, the $O_2$ gas is supplied to the substrate 101. Specifically, a flow rate of the $O_2$ gas supplied to the substrate 101 may be set within a range from 0.2 slm to 10 slm, and more preferably, within a range from 1 slm to 5 slm.

When supplying the $O_2$ gas, by stopping a supply of the $N_2$ gas to the gas supply structure 150 through the second gas supply pipe 154, the supply of the $N_2$ gas into the reaction tube 120 and the inner tube 130 is stopped in order to prevent the $N_2$ gas from being supplied into the reaction tube 120 together with the $O_2$ gas. That is, the $O_2$ gas is supplied into the reaction tube 120 and the inner tube 130 without being diluted with the $N_2$ gas. As a result, it is possible to improve a film-forming rate of the $SiO_2$ film. In the reactive gas supply step S5053, the temperature of the heater 110 is set to substantially the same temperature as that of the source gas supply step S5051.

In the reactive gas supply step S5053, the $O_2$ gas is supplied into the reaction tube 120 and the inner tube 130 without any other gas being supplied into the reaction tube 120 and the inner tube 130 together with the $O_2$ gas. A substitution reaction occurs between the $O_2$ gas and at least a portion of the silicon-containing layer formed on the substrate 101 in the source gas ($Si_2Cl_6$ gas) supply step S5051. During the substitution reaction, silicon (Si) contained in the silicon-containing layer and oxygen (O) contained in the $O_2$ gas are bonded together. As a result, an $SiO_2$ layer containing silicon and oxygen is formed on the substrate 101.

Reactive Gas Exhaust Step: S5054

After the $SiO_2$ layer is formed, a supply of the $O_2$ gas into the reaction tube 120 and the inner tube 130 through the nozzle 1521 is stopped. Then, the residual gas in the reaction tube 120 and the inner tube 130 such as the $O_2$ gas which did not react or which contributed to the formation of the $SiO_2$ layer and reaction by-products are removed out of the reaction tube 120 and the inner tube 130 in the same manners as in the source gas exhaust step S5052.

Determination Step (Performing a Predetermined Number of Times): S5055

By performing a cycle of the step S505 in which the step S5051 through the step S5054 described above are sequentially performed in this order one or more times (that is, a predetermined number of times (n times)), the $SiO_2$ film of a predetermined thickness (for example, 0.1 nm to 2 nm) is formed on the substrate 101. It is preferable that the cycle described above is repeatedly performed a plurality of times, for example, preferably about 10 times to 80 times, and more preferably about 10 times to 15 times. Thereby, it is possible to form the film with a uniform thickness distribution on the surface of the substrate 101.

After-Purge Step (Purge Step And Returning to Atmospheric Pressure Step): S506

After repeatedly performing the step S5051 through step S5055 of the step S505 the predetermined number of times, the $N_2$ gas is supplied into the reaction tube 120 and the inner tube 130 through the nozzle 1521, and is exhausted through the exhaust pipe 121. The $N_2$ gas serves as the purge gas, and inner atmospheres of the reaction tube 120 and the inner tube 130 are purged with the $N_2$ gas serving as the inert gas. Thereby, the residual gas in the reaction tube 120 and the inner tube 130 and the reaction by-products remaining in the reaction tube 120 and the inner tube 130 are removed out of the reaction tube 120. Then, the $N_2$ gas is filled in the reaction tube 120 until the inner pressure of the reaction tube 120 reaches an atmospheric pressure.

Substrate Unloading Step: S507

Thereafter, the substrate support 140 is lowered from the inner tube 130 of the reaction tube 120 by operating the vertical driver (not shown). Then, the substrate 101 with the film of the predetermined thickness formed on the surface thereof is transferred (discharged) out of the substrate support 140. Thereby, the processing of the substrate 101 is completed.

While the present embodiment is described by way of an example in which the $SiO_2$ film is formed on the substrate 101, the present embodiment is not limited thereto. For example, instead of the $SiO_2$ film, the present embodiment may also be applied when a silicon nitride film ($Si_3N_4$ film) or a titanium nitride film (TiN film) is formed. In addition, the present embodiment may also be applied to form another film other than the films described above. For example, the present embodiment may also be applied to form a film containing an element such as tungsten (W), tantalum (Ta), ruthenium (Ru), molybdenum (Mo), zirconium (Zr), hafnium (Hf), aluminum (Al), silicon (Si), germanium (Ge) and gallium (Ga), a film containing an element of the same family as the elements described above, a compound film of one or more elements described above and nitrogen (that is, a nitride film) or a compound film of one or more elements described above and oxygen (that is, an oxide film). Further, when forming the films described above, a halogen-containing gas or a gas containing at least one of a halogen element, an amino group, a cyclopentane group, oxygen (O), carbon (C) or an alkyl group may be used.

According to the present embodiment, the formation of the reaction product can be suppressed when the film is being formed on the substrate 101. As a result, it is possible to prevent the reaction product from adhering to the surface of the substrate 101 inside the inner tube 130, and it is also possible to stably maintain the high quality of the film formed on the surface of the substrate 101.

First Modified Example of First Embodiment

Figure 6:
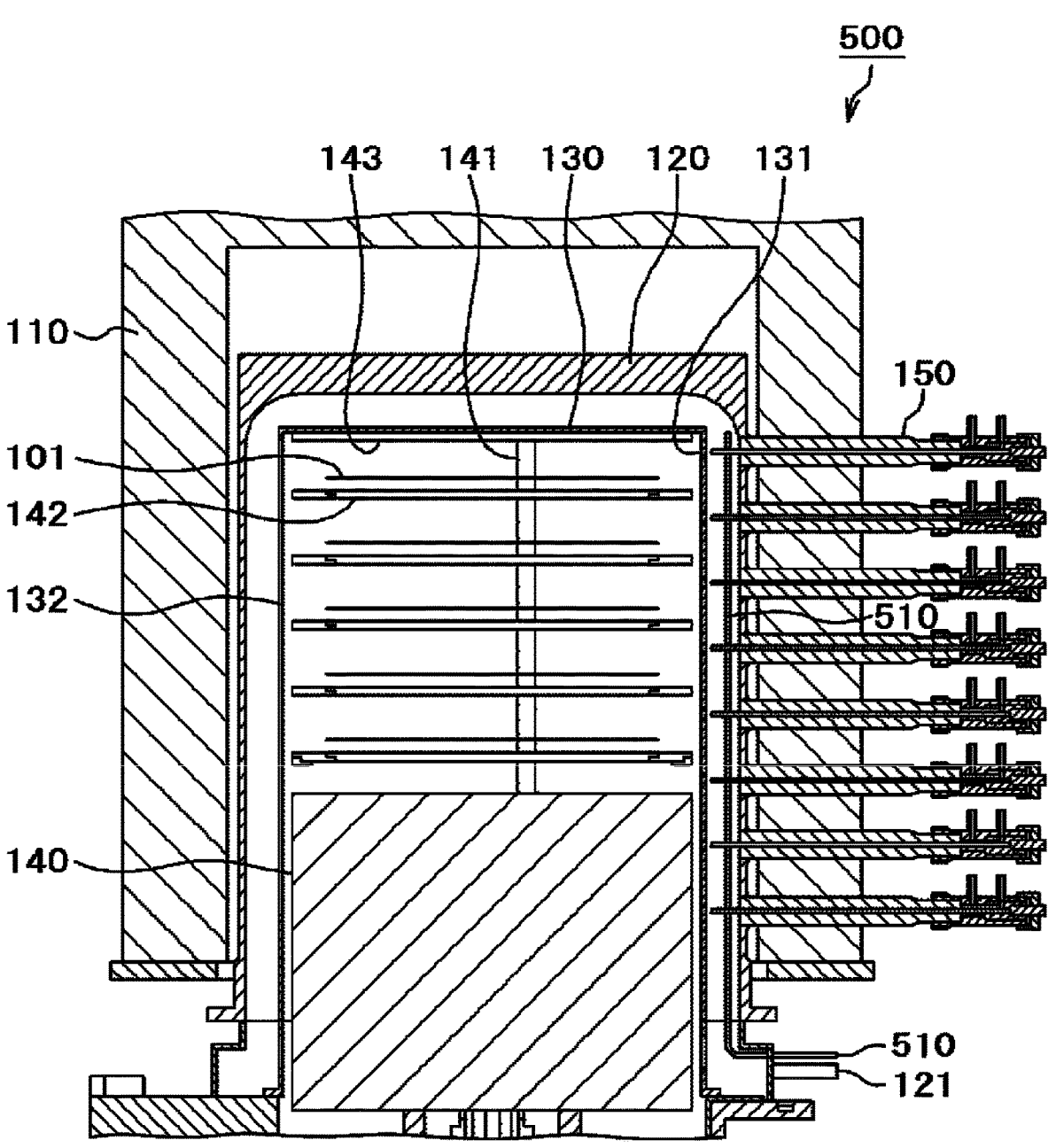
FIG. 6 is a diagram schematically illustrating a cross-section of a part of a substrate processing apparatus according to a first modified example of the first embodiment of the present disclosure.

The first embodiment is described by way of an example in which the gas (the source gas or the reactive gas) and the inert gas are supplied along the coaxial direction parallel to the surface of the substrate 101 supported by the substrate support 140 in the inner tube 130. On the other hand, according to a first modified example of the first embodiment, as shown in FIG. 6, the gas (the source gas or the reactive gas) is supplied along the direction parallel to the surface of the substrate 101 as in the first embodiment, and the inert gas is supplied through a gas supply pipe 510 arranged in the vertical direction inside the reaction tube 120.

Figure 7:
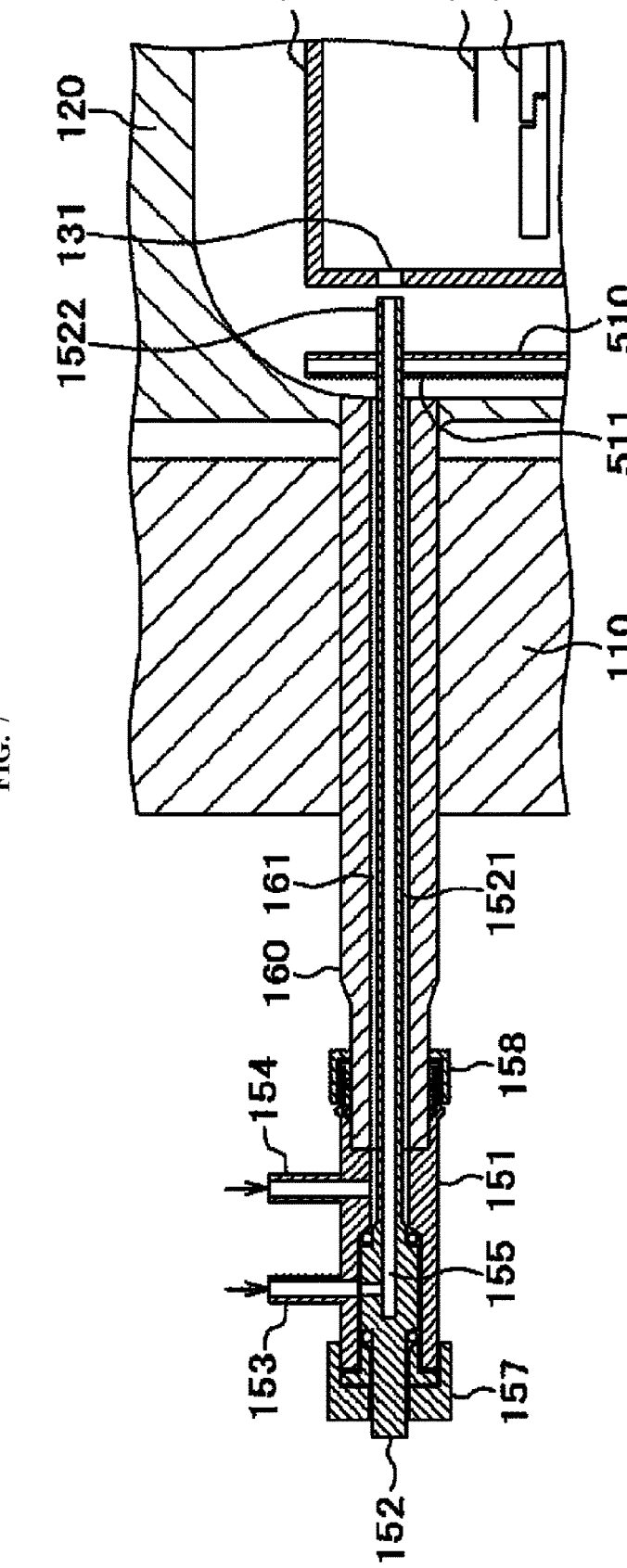
FIG. 7 is a diagram schematically illustrating a cross-section of a part of the substrate processing apparatus according to the first modified example of the first embodiment of the present disclosure when a gas supply structure of the substrate processing apparatus according to the first modified example is attached to the inner tube.

FIG. 7 is a diagram schematically illustrating a cross-section of a part of a substrate processing apparatus 500 according to the present modified example when a gas supply structure 150 of the substrate processing apparatus 500 is attached to the inner tube 130. A configuration of the gas supply structure 150 through which the gas (the source gas or the reactive gas) is supplied is substantially the same as that described in the first embodiment. However, according to the present modified example, the second gas supply pipe 154 is used to discharge the inert gas (which is supplied into the reaction tube 120 through the gas supply pipe 510) to the outside of the reaction tube 120.

That is, according to the present modified example, while supplying the gas (the source gas or the reactive gas) through the front end 1522 of the nozzle 1521 of the gas supply structure 150, the inert gas is supplied into the reaction tube 120 through the gas supply pipe 510 arranged in the vertical direction inside the reaction tube 120 via a plurality of holes 511 provided corresponding to the gas supply structure 150.

Thereby, in the gas supply pipe 510, the inert gas is supplied to the vicinity of the front end 1522 of the nozzle 1521 of the introduction pipe structure 152, and the formation of the reaction product by the gas supplied through the first gas supply pipe 153 to the vicinity of the front end 1522 can be suppressed.

As a result, by suppressing the formation of the reaction product, it is possible to prevent the reaction product from adhering to the surface of the substrate 101 inside the inner tube 130, and it is also possible to maintain the high quality of the film formed on the surface of the substrate 101.

Further, the present modified example is described by way of an example in which the gas supply pipe 510 is of a straight shape. However, the gas supply pipe 510 may be of a U-turn shape being bent at a front end thereof. Further, in the present modified example, the second gas supply pipe 154 may be omitted.

Second Modified Example of First Embodiment

Figure 8:
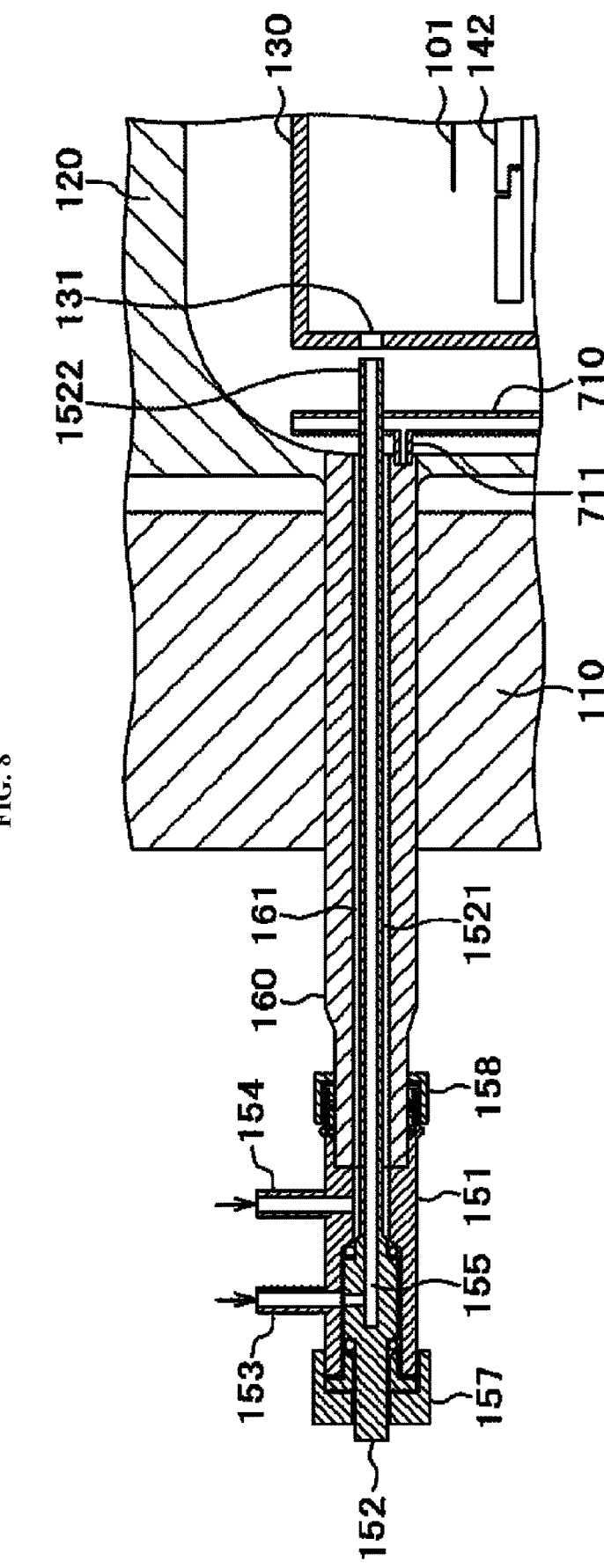
FIG. 8 is a diagram schematically illustrating a cross-section of a part of a substrate processing apparatus according to a second modified example of the first embodiment of the present disclosure when a gas supply structure of the substrate processing apparatus according to the second modified example is attached to the inner tube.

According to the first modified example, the inert gas is supplied into the reaction tube 120 through the plurality of holes 511 provided at the gas supply pipe 510 arranged in the vertical direction inside the reaction tube 120. However, according to a second modified example of the first embodiment, as shown in FIG. 8, instead of the plurality of holes 511, the inert gas is supplied into the reaction tube 120 through a plurality of protrusions 711 each provided with a hole therein.

According to the present modified example, the inert gas is supplied to the vicinity of the front end 1522 of the nozzle 1521 of the introduction pipe structure 152 through a gas supply pipe 710, and the formation of the reaction product by the gas supplied through the first gas supply pipe 153 to the vicinity of the front end 1522 can be suppressed.

As a result, by suppressing the formation of the reaction product, it is possible to prevent the reaction product from adhering to the surface of the substrate 101 inside the inner tube 130, and it is also possible to maintain the high quality of the film formed on the surface of the substrate 101.

Further, the present modified example is described above by way of an example in which the gas supply pipe 710 is of a straight shape and the plurality of protrusions 711 are provided at the gas supply pipe 710 such that a structure of a comb shape is formed. However, instead of the gas supply pipe 710, a plurality of gas supply pipes each of a straight shape are provided, and the plurality of protrusions 711 are provided at the plurality of gas supply pipes, respectively, at locations corresponding to the front end 1522 of the nozzle 1521 such that a structure of a F (gamma) shape is formed. Further, in the present modified example, the second gas supply pipe 154 may be omitted.

Second Embodiment

Figure 9:
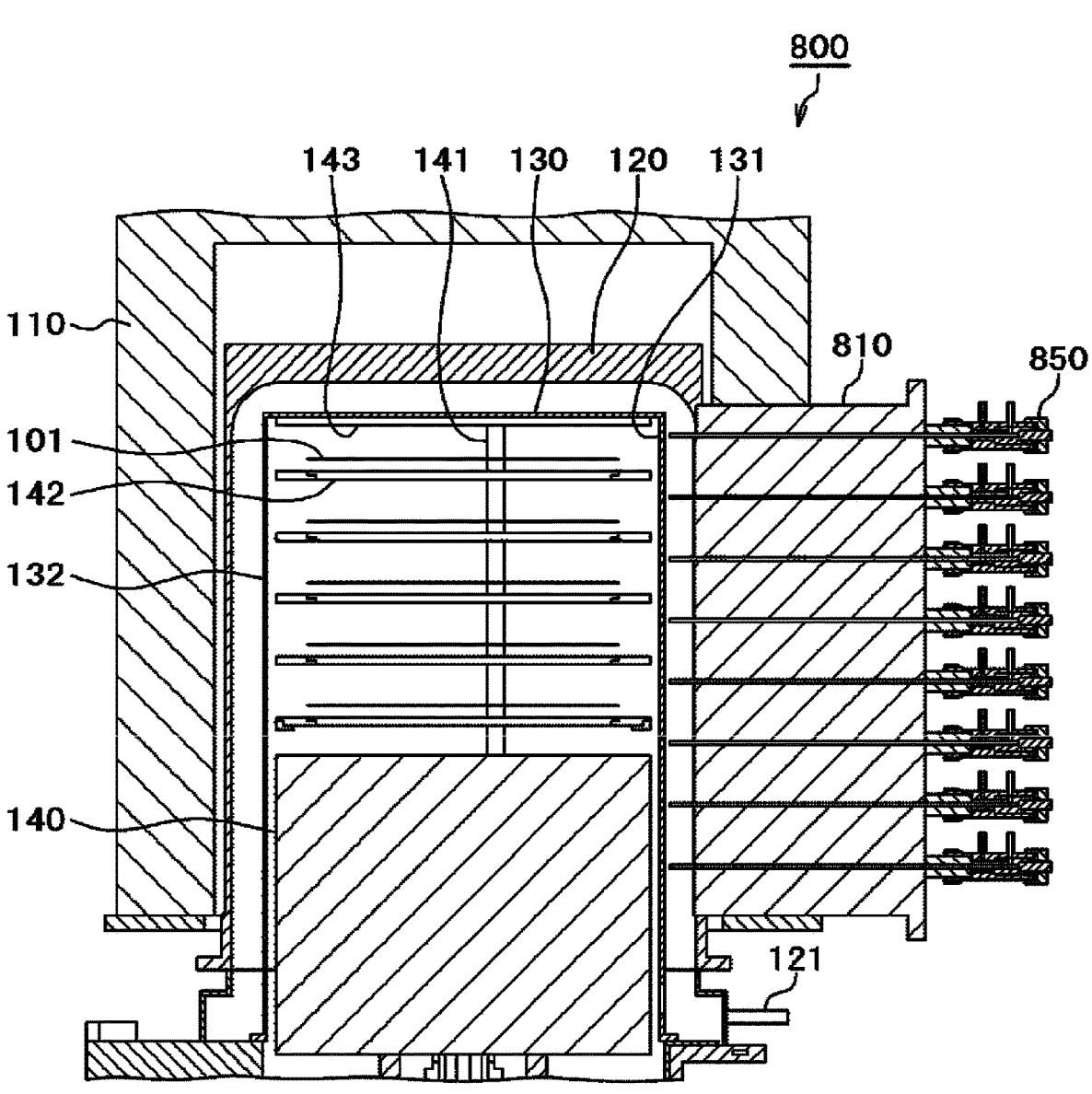
FIG. 9 is a diagram schematically illustrating a cross-section of a part of a substrate processing apparatus according to a second embodiment of the present disclosure.

A second embodiment of the technique of the present disclosure will be described with reference to FIG. 9. FIG. 9 is a diagram schematically illustrating a cross-section of a part of a substrate processing apparatus 800 according to the second embodiment of the present disclosure. The same reference numerals are assigned to the same components as in the first embodiment described with reference to FIG. 1A.

The second embodiment is different from the first embodiment described with reference to FIG. 1A in that a nozzle accommodation structure 810 capable of accommodating a plurality of gas supply structures including a gas supply structure 850 is provided instead of the nozzle accommodation structure of a pipe shape of the first embodiment.

The reaction tube 120, the inner tube 130 and the substrate support (boat) 140 are provided, and the substrates including the substrate (wafer) 101 are supported by the substrate support 140. The partition plates 142 supported by the partition plate support 141 are provided so as to space apart (or separate) from the substrates 101. The reference numeral 143 indicates the top plate provided at the top of the partition plates 142. By using the vertical driver (which is the boat elevator) (not shown), the substrates 101 accommodated in the substrate support 140 may be transferred (loaded) into or transferred (unloaded) out of the inner tube 130.

The reference numeral 110 indicates the heater. With the substrate support 140 provided in the inner tube 130 by operating the vertical driver (not shown), the heater 110 is capable of heating the inner tube 130 (and the reaction tube 120). For example, the heater 110 may be divided into the plurality of heater structures (blocks) in the vertical direction, and the heating state of the heater 110 can be controlled for each heater structure.

The reference numeral 850 indicates the gas supply structure through which the gas such as the source gas and the reactive gas is supplied into the inner tube 130. A plurality of gas supply structures including the gas supply structure 850 are provided in the same plane as a cross-section shown in FIG. 9 such that the gas is supplied to each of the substrates 101 according to the vertical pitch (interval) of the substrates 101 supported by the substrate support 140. Hereinafter, the plurality of gas supply structures including the gas supply structure 850 may also be simply referred to as gas supply structures 850. The gas supply structures 850 are arranged in the direction substantially parallel to the surfaces of the substrates 101 supported by the substrate support 140 in the inner tube 130.

The reference numeral 810 indicates the nozzle accommodation structure 810 capable of simultaneously accommodating the gas supply structures 850, and is connected to the reaction tube 120 through the heater 110 while simultaneously accommodating the gas supply structures 850. The gas supply structure 850 accommodated in the nozzle accommodation structure 810 includes substantially the same configuration as that described above with reference to FIGS. 2 through 4 in the first embodiment. A front end (tip) of a nozzle (which corresponds to the nozzle 1521 in the first embodiment) of the gas supply structure 850 is provided at a location immediately before the gas introduction hole 131 provided in the inner tube 130.

In addition, the slit 132 is provided in the portion of the inner tube 130 facing the locations where the gas introduction holes 131 are provided. A part of the gas supplied into the inner tube 130 through the gas introduction holes 131, which did not contribute to the reaction inside the inner tube 130 such as the reaction on the surfaces of the substrates 101 supported by the substrate support 140, is discharged (or exhausted) from the inside of the inner tube 130.

The gas discharged from the inside of the inner tube 130 toward the reaction tube 120 through the slit 132 is discharged to the outside of the reaction tube 120 by the exhaust structure (not shown) through the exhaust pipe 121.

According to the present embodiment, the gas supply structures 850 can be collectively handled by using the nozzle accommodation structure 810. Thereby, it is possible to relatively easily perform a maintenance operation of the gas supply structures 850 of the substrate processing apparatus 800.

According to the present embodiment, the formation of the reaction product can be suppressed when the film is being formed on the substrate 101. As a result, it is possible to prevent the reaction product from adhering to the surface of the substrate 101 inside the inner tube 130, and it is also possible to stably maintain the high quality of the film formed on the surface of the substrate 101.

For example, the technique of the present disclosure may include the following examples.

(1) A substrate processing apparatus including:

a reaction tube in which a substrate is accommodated;

a nozzle accommodation structure provided at a side surface of the reaction tube and extending in a horizontal direction of the substrate;

a gas supply nozzle inserted in the nozzle accommodation structure from an outside of the reaction tube;

a first gas supply structure through which a first is supplied into the gas supply nozzle; and a second gas supply structure through which a second gas is supplied into the nozzle accommodation structure.

(2) An inner tube is further provided inside the reaction tube.

(3) The inner tube is provided with an opening facing an opening of the gas supply nozzle.

(4) A front end of the gas supply nozzle is configured to be insertable up to an inner wall of the inner tube.

(5) The second gas is supplied to a space between the reaction tube and the inner tube.

(6) The second gas is supplied to a space between the nozzle accommodation structure and the gas supply nozzle.

(7) The second gas supply structure is connected in a direction perpendicular to a surface of the nozzle accommodation structure extending in the horizontal direction of the substrate.

(8) The nozzle accommodation structure is of a pipe shape, and the second gas supply structure is connected to a wall of the nozzle accommodation structure of the pipe shape.

(9) A fixture capable of fixing the gas supply nozzle is provided in the nozzle accommodation structure, and the second gas supply structure is configured to be capable of supplying the second gas via the fixture.

(10) An exhaust pipe through which an inner atmosphere of the nozzle accommodation structure is exhausted is provided at the nozzle accommodation structure.

(11) The inner tube is further provided inside the reaction tube, and a third gas supply structure through which the second gas is supplied to the space between the reaction tube and the inner tube is further provided.

(12) The third gas supply structure is provided with an opening or a protrusion protruding toward the nozzle accommodation structure at a position corresponding to the nozzle accommodation structure.

(13) The third gas supply structure is of a straight shape, a $\Gamma$ (gamma) shape, a U-turn shape, or a comb shape.

(14) A first flow rate regulator capable of adjusting a flow rate of the first gas is further provided at the first gas supply structure, a second flow rate regulator capable of adjusting a flow rate of the second gas is further provided at the second gas supply structure, and a controller configured to be capable of controlling the first flow rate regulator and the second flow rate regulator such that the flow rate of the second gas is smaller than the flow rate of the first gas is further provided.

(15) The controller is configured to be capable of controlling the first flow rate regulator and the second flow rate regulator such that the flow rate of the second gas is set to $1/10$ or less of the flow rate of the first gas.

(16) The controller is further configured to be capable of controlling a program included in the controller such that a flow rate exceeding $1/10$ of the flow rate of the first gas cannot be set as the flow rate of the second gas.

(17) The second gas supply structure is provided at the nozzle accommodation structure.

(18) A plurality of first gas supply structures including the first gas supply structure are provided at the nozzle accommodation structure.

(19) The first gas includes a process gas, and the second gas includes an inert gas.

(20) The process gas includes one or both of a source gas and a reactive gas.

Other Embodiments

While the technique of the present disclosure is described in detail by way of the above-described embodiments, the technique of the present disclosure is not limited thereto. The technique of the present disclosure may be modified in various ways without departing from the scope thereof.

For example, the embodiments are described by way an example in which a plurality of a gas supply nozzles (for example, the plurality of nozzles including the nozzle 1521) are provided. However, the technique of the present disclosure is not limited thereto. For example, the technique of the present disclosure may also be applied when one nozzle is provided instead of the plurality of gas supply nozzles.

For example, the embodiments are described by way an example in which the substrates are supported by the substrate support. However, the technique of the present disclosure is not limited thereto. For example, the technique of the present disclosure may also be applied when a single substrate is supported by the substrate support, or when the substrate support is configured to support the single substrate.

For example, the embodiments are described by way an example in which the film-forming process is performed as the part of the manufacturing process of the semiconductor device. However, the technique of the present disclosure is not limited thereto. For example, the technique of the present disclosure may also be applied when other processes such as a heat treatment process and a plasma treatment process are performed.

For example, the embodiments are described by way an example in which the substrate processing apparatus capable of performing the part of the manufacturing process of the semiconductor device is used. However, the technique of the present disclosure is not limited thereto. For example, the technique of the present disclosure may also be applied when other substrate processing apparatuses capable of processing a substrate such as a ceramic substrate, a substrate of a liquid crystal device and a substrate of a light emitting device are used.

According to some embodiments of the present disclosure, it is possible to improve the processing uniformity for each of the plurality of substrates.

What is claimed is:

1. A substrate processing apparatus comprising:

a reaction tube in which a plurality of substrates are accommodated;

an inner tube provided inside the reaction tube;

a plurality of nozzle accommodation structures provided at a side surface of the reaction tube and extending in a direction parallel to surfaces of the plurality of substrates;

a plurality of gas supply nozzles inserted in the plurality of nozzle accommodation structures, respectively, to extend from an outside of the reaction tube to an inside of the reaction tube, and configured to supply a gas to each of the plurality of substrates such that the gas is supplied in the direction parallel to the surfaces of the plurality of substrates;

a first gas supply structure through which a first gas is supplied to the plurality of gas supply nozzles;

a gap provided between each of the plurality of nozzle accommodation structures and one of the plurality of gas supply nozzles corresponding thereto; and a second gas supply structure from which a second gas is supplied to the gap, wherein the second gas is supplied to a front end of each of the plurality of gas supply nozzles via the gap while the first gas is being supplied, wherein an opening is provided at a first wall surface of the inner tube at a location facing the front end of each of the plurality of gas supply nozzles, and wherein the front end of each of the plurality of gas supply nozzles extends toward and ends before the opening of the first wall surface of the inner tube.

2. The substrate processing apparatus of claim 1, further comprising:

wherein a plurality of openings are provided at a wall surface of the inner tube at locations facing the front end of each of the plurality of gas supply nozzles extending to the inside of the reaction tube.

3. The substrate processing apparatus of claim 1, wherein the plurality of gas supply nozzles are arranged in a vertical direction at an interval equal to that of the plurality of substrates such that the gas is supplied to each of the plurality of substrates.

4. The substrate processing apparatus of claim 3, wherein the plurality of gas supply nozzles are arranged in the vertical direction at the interval equal to that of the plurality of substrates, and wherein the plurality of gas supply nozzles are accommodated in the plurality of nozzle accommodation structures, respectively.

5. The substrate processing apparatus of claim 1, further comprising:

a heater provided so as to cover a periphery of the reaction tube, wherein the plurality of nozzle accommodation structures are arranged in a vertical direction at an interval equal to that of the plurality of substrates, and wherein the plurality of nozzle accommodation structures penetrate the heater at the side surface of the reaction tube in the direction parallel to the surfaces of the plurality of substrates.

6. The substrate processing apparatus of claim 1, wherein:

the second gas supply structure comprises a supply pipe extending in a vertical direction and provided with a plurality of holes through which the second gas is ejected, and the plurality of substrates are accommodated in the reaction tube with a predetermined interval therebetween, the plurality of gas supply nozzles are provided in the reaction tube, the supply pipe extends in the vertical direction corresponding to the plurality of substrates, and the plurality of holes are provided at the supply pipe at locations corresponding to the plurality of gas supply nozzles.

7. The substrate processing apparatus of claim 6, further comprising:

wherein the supply pipe is provided between the reaction tube and the inner tube.

8. The substrate processing apparatus of claim 1, wherein the plurality of nozzle accommodation structures are configured such that the gas supply nozzles are accommodated in the nozzle accommodation structures.

9. The substrate processing apparatus of claim 1, wherein a gas supply port is provided at the front end of each of the plurality of gas supply nozzles, and wherein the gas supply port is configured to supply the gas in the direction parallel to surfaces of the plurality of substrates.

10. The substrate processing apparatus of claim 9, wherein the plurality of gas supply nozzles are inserted in the plurality of nozzle accommodation structures, respectively, to extend from the outside of the reaction tube to the inside of the reaction tube.

11. The substrate processing apparatus of claim 1, further comprising:

wherein a plurality of gas introduction holes are provided in the inner tube at locations where the front end of each of the plurality of gas supply nozzles are provided.

12. The substrate processing apparatus of claim 1, wherein the first gas and the second gas are supplied into the reaction tube from the front end of each of the plurality of gas supply nozzles along the direction parallel to the surfaces of the plurality of substrates.

13. A method of manufacturing a semiconductor device using the substrate processing apparatus of claim 1, the method comprising:

(a) accommodating the plurality of substrates in the reaction tube; and (b) supplying the first gas to the plurality of substrates through the plurality of gas supply nozzles such that the first gas is discharged in a direction parallel to surfaces of the plurality of substrates.

14. The method of claim 13, wherein (b) comprises:

(b-1) supplying a source gas or a reactive gas into the reaction tube through the plurality of gas supply nozzles as the first gas; and (b-2) supplying an inert gas to a vicinity of the front end of each of the plurality of gas supply nozzles, wherein (b-1) and (b-2) are performed in parallel.

15. The method of claim 14, wherein, in (b-2), the inert gas is supplied to the vicinity of the front end of each of the plurality of gas supply nozzles along a coaxial direction of the plurality of gas supply nozzles through which the source gas or the reactive gas is supplied into the reaction tube.

16. The method of claim 14, wherein, in (b), a flow rate of the inert gas supplied to the vicinity of the front end of each of the plurality of gas supply nozzles is set to $\frac{1}{10}$ or less of a flow rate of the source gas or the reactive gas supplied through the plurality of gas supply nozzles.

17. A non-transitory computer-readable recording medium storing a program that causes, by a computer, using the substrate processing apparatus of claim 1 to perform:

(a) accommodating the plurality of substrates in the reaction tube; and (b) supplying the first gas to the plurality of substrates through the plurality of gas supply nozzles such that the first gas is discharged in a direction parallel to surfaces of the plurality of substrates.

* * * * *